(12) United States Patent
Arai et al.

(10) Patent No.: US 6,322,910 B1
(45) Date of Patent: *Nov. 27, 2001

(54) ORGANIC ELECTROLUMINESCENT DEVICE

(75) Inventors: Michio Arai; Isamu Kobori; Etsuo Mitsuhashi, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/339,807

(22) Filed: Jun. 25, 1999

(30) Foreign Application Priority Data

Jul. 22, 1998 (JP) .................................................. 10-222272

(51) Int. Cl.⁷ .................................................... H05B 33/00
(52) U.S. Cl. ........................ 428/690; 313/502; 313/503; 313/504; 252/301.16; 257/103
(58) Field of Search ..................... 428/690, 917; 313/502–506; 252/301.16; 257/103

(56) References Cited

U.S. PATENT DOCUMENTS

| 5,952,779 | 9/1999 | Arai et al. . |
|---|---|---|
| 5,969,474 | 10/1999 | Arai . |
| 5,981,092 | * 11/1999 | Arai et al. ............................. 428/690 |
| 5,990,605 | * 11/1999 | Yoshikawa et al. ................. 313/310 |
| 6,166,488 | * 12/2000 | Arai ..................................... 313/504 |
| 6,198,219 | * 3/2001 | Arai et al. ............................ 313/504 |

FOREIGN PATENT DOCUMENTS

| 2-139893 | 5/1990 | (JP) . |
|---|---|---|
| 5-3080 | 1/1993 | (JP) . |

* cited by examiner

*Primary Examiner*—Cynthia H. Kelly
*Assistant Examiner*—Dawn Garrett
(74) *Attorney, Agent, or Firm*—Oblon, Spivak, McClelland, Maier & Neustadt, P.C.

(57) ABSTRACT

An organic EL device comprises a substrate, a hole injecting electrode and an electron injecting electrode formed on the substrate and at least an organic layer taking part in light emitting function and located between these electrodes. Between the electron injecting electrode and the organic layer there is an inorganic insulating electron injecting layer comprising as a main component an oxide having an electron affinity of up to 3 eV with a stabilizing component added thereto. The organic EL device possesses the merits of both an organic material and an inorganic material, and has an extended life, an improved efficiency, a low driving voltage, and so is of great practical value.

10 Claims, 2 Drawing Sheets

PRIOR ART

FIG. 4

PRIOR ART

ORGANIC ELECTROLUMINESCENT DEVICE

BACKGROUND OF THE INVENTION

TECHNICAL ART

The present invention relates generally to an organic EL (electroluminescent) device, and more specifically to an inorganic/organic junction structure used for a device comprising an organic compound thin film which emits light at an applied electric field.

PRIOR ART

In general, an organic EL device is basically built up of an ITO or other transparent electrode formed on a glass substrate, an organic amine base hole transporting layer laminated on the transparent electrode, an organic light emitting layer formed of a material having electronic conductivity and giving out strong light emission, for instance, an Alq3 material, and an electrode provided on the organic light emitting layer and formed of a material having a low work function, for instance, an MgAg material.

As reported so far in the art, the device has a structure wherein one or plural organic compound layers are interleaved between a hole injecting electrode and an electron injecting electrode. The organic compound layer has a double- or triple-layer structure.

Examples of the double-layer structure are a structure wherein a hole transporting layer and a light emitting layer are formed between the hole injecting electrode and the electron injecting electrode, and a structure wherein a light emitting layer and an electron transporting layer are formed between the hole injecting electrode and the electron injecting electrode. In an exemplary triple-layer structure, a hole transporting layer, a light emitting layer and an electron transporting layer are provided between the hole injecting electrode and the electron injecting electrode. A single-layer structure wherein a single layer has all functions, too, is reported in conjunction with a polymer or mixture system.

Figure 3:
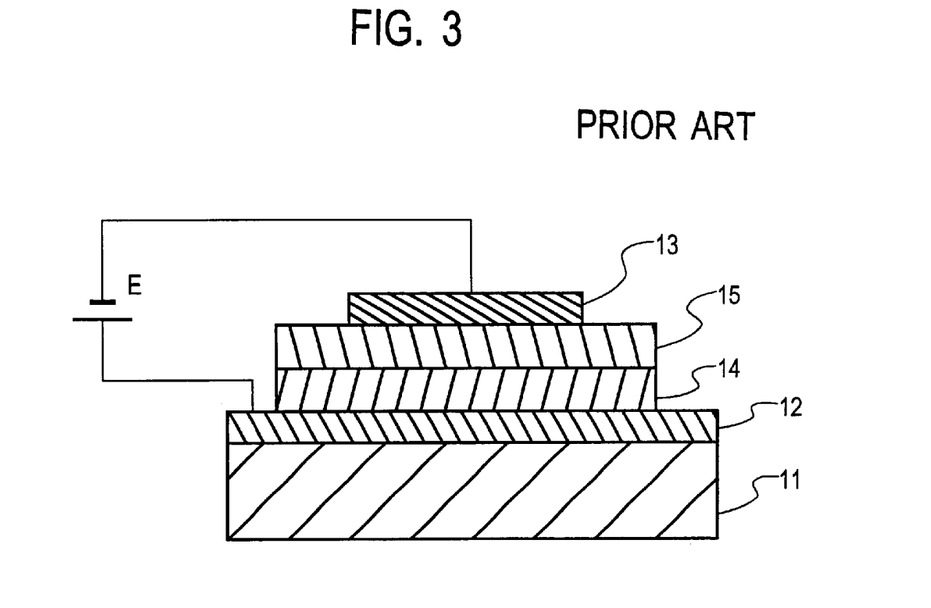
FIG. 3 is a sectional view of an organic EL device comprising a hole transporting layer and having a double-layer structure.
Figure 4:
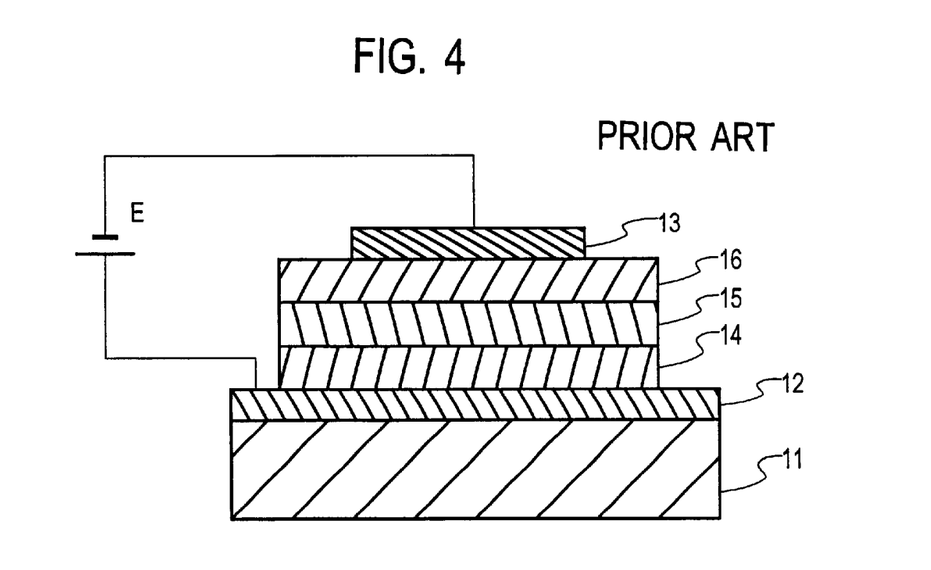
FIG. 4 is a sectional view of an organic EL device comprising a hole transporting layer and an electron transporting layer and having a triple-layer structure.

Typical structures of the organic EL device are shown in FIGS. 3 and 4.

In FIG. 3, a hole transporting layer 14 and a light emitting layer 15, each made of an organic compound, are formed between a hole injecting electrode 12 provided on a substrate 11 and an electron injecting electrode 13. In this case, the light emitting layer 15 also functions as an electron transporting layer.

In FIG. 4, a hole transporting layer 14, a light emitting layer 15 and an electron transporting layer 16, each made of an organic compound, are formed between a hole injecting electrode 12 provided on a substrate 11 and an electron injecting electrode 13.

A problem common to these organic EL devices is reliability. In principle, an organic EL device comprises a hole injecting electrode and an electron injecting electrode and requires an organic layer for efficient injection and transportation of holes and electrons from between these electrodes. However, these materials are sensitive to damages during device fabrication, and offer a problem in conjunction with an affinity for electrodes. Another problem is that the deterioration of an organic thin film is much severer than that of an LED or LD.

Most organic materials are relatively expensive. Otherwise stated, there is a great merit in providing low-cost organic EL device products by substituting a partial constitution film with an inexpensive inorganic material.

Furthermore, the development of a device having higher light emission efficiency, lower driving voltage and lesser power consumption than ever before is strongly desired.

To provide a solution to such problems, methods of taking advantage of merits of both an organic material and an inorganic semiconductor material have been envisaged. That is, an organic/inorganic semiconductor junction structure wherein an organic hole transporting layer is substituted by an inorganic p-type semiconductor has been contemplated. Such contemplation has been investigated in Japanese Patent No. 2636341, and JP-A's 2-139893, 2-207488 and 6-119973. However, it is still difficult to obtain an organic EL device superior to prior art organic ELs in terms of emission performance and basic device reliability.

One object of the invention is to provide an organic EL device which possesses the merits of both an organic material and an inorganic material, has an extended life, an improved light emission efficiency and a low driving voltage, and is fabricated at low cost.

SUMMARY OF THE INVENTION

The above object is achieved by the inventions defined below as (1) to (9).

(1) An organic electroluminescent device comprising a substrate, a hole injecting electrode and an electron injecting electrode formed on said substrate, and at least an organic layer located between said electrodes, said organic layer taking part in light emitting function, wherein:

between said electron injecting electrode and said organic layer there is an inorganic insulating electron injecting layer comprising as a main component an oxide having an electron affinity of up to 3 eV, with a stabilizing component added thereto.

(2) The organic electroluminescent device according to (1), wherein said inorganic electron injecting layer comprises as said stabilizing component germanium oxide or $GeO_2$ and/or silicon oxide or $SiO_2$.

(3) The organic electroluminescent device according to (1) or (2), wherein the germanium oxide or $GeO_2$ and/or silicon oxide or $SiO_2$ acting as said stabilizing component are contained in an amount, as calculated on $GeO_2$ and/or $SiO_2$ bases, of up to 50 mol % relative to said main component.

(4) The organic electroluminescent device according to any one of (1) to (3), wherein said inorganic insulating electron injecting layer comprises as said main component one or two or more of lithium oxide or $Li_2O_3$, sodium oxide or $Na_2O$, potassium oxide or $K_2O$, rubidium oxide or $Rb_2O$, cesium oxide or $Cs_2O$, calcium oxide or CaO, strontium oxide or SrO, barium oxide or BaO, yttrium oxide or $Y_2O_3$, hafnium oxide or $HfO_2$, terbium oxide or $Tb_2O_3$, and thorium oxide or $ThO_2$.

(5) The organic electroluminescent device according to any one of (1) to (4), which comprises, in order from a substrate, at least an electron injecting electrode, an inorganic insulating electron injecting layer, a light emitting layer and a hole injecting layer laminated together thereon.

(6) The organic electroluminescent device according to any one of (1) to (5), wherein said inorganic electron injecting layer has a structure where oxygen is present in a larger amount on an organic layer side and oxygen is present in a smaller amount on an electron injecting electrode side.

(7) The organic electroluminescent device according to (6), which comprises, in order from a substrate, at least a hole injecting electrode, an organic layer, an inorganic electron injecting layer and an electron injecting electrode laminated together thereon.

(8) A method of fabricating an organic electroluminescent device by forming between an electron injecting electrode and an organic layer an inorganic electron injecting layer comprising as a main component an oxide having an electron affinity of up to 3 eV with a stabilizing component added thereto, wherein:

one portion of said inorganic electron injecting layer corresponding to 1/5 to 4/5 of a total thickness thereof is formed with no oxygen added thereto, and another portion is formed with about 1 to 99% Of $O_2$ added thereto.

(9) The organic electroluminescent device fabrication method according to (8), wherein an organic electroluminescent device as recited in (6) or (7) is obtained.

DETAILED EXPLANATION OF THE PREFERRED EMBODIMENTS

The organic EL device of the invention comprises a substrate, a hole injecting electrode and an electron injecting electrode formed on the substrate, and at least an organic layer taking part in light emitting function and located between these electrodes, wherein between said electron injecting electrode and said organic layer there is provided an inorganic insulating electron injecting layer. The inorganic insulating electron injecting layer comprises as a main component an oxide having an electron affinity of up to 3 eV, with a stabilizing component added thereto.

By using an inorganic insulating electron injecting layer comprising as its main component an oxide having an electron affinity of up to 3 eV, with a stabilizing component added thereto, it is thus possible to provide efficient injection of electrons from the electron injecting electrode into the organic layer forming the light emitting layer side and, hence, inhibit migration of holes from the organic layer side to the electron injecting electrode, thereby ensuring efficient recombination of holes and electrons in the light emitting layer. That is, the inorganic insulating electron injecting layer has a work function of about 3.0 eV and a band gap of about 5 to 8 eV in a conduction band, and so it is possible to provide efficient injection of electrons from the electron injecting electrode into the light emitting layer and inhibit migration of holes to the electron injecting electrode. The work function may be appropriately controlled for use by the following work function control component. In addition, the organic EL device can have both the merits of the inorganic material such as weather resistance and heat resistance and the merits of the organic material such as a high degree of design flexibility regarding emission wavelength and emission performance.

The inorganic insulating electron injecting layer contains as its main component an oxide having an electron affinity of up to 3 eV, and preferably 0.8 to 3 eV. Materials having low hygroscopicity upon left standing in the atmosphere are also preferred to this end, because they are stable. Such materials, for instance, include lithium oxide ($Li_2O_3$), sodium oxide ($Na_2O$), potassium oxide ($K_2O$), rubidium oxide ($Rb_2O$), cesium oxide ($Cs_2O$), calcium oxide (CaO), strontium oxide (SrO), barium oxide (BaO), yttrium oxide ($Y_2O_3$), hafnium oxide ($HfO_2$), terbium oxide ($Tb_2O_3$), and thorium oxide ($ThO_2$). These oxides may be used singly or in combination of two or more.

For the stabilizing component, it is preferable to use an oxide having very low hygroscopicity even upon left standing in the atmosphere, and especially silicon oxide ($SiO_2$) and/or germanium oxide ($GeO_2$). These oxides, which are used if required, should be used in an amount of preferably up to 50 mol %, and especially 0.8 to 50 mol % as calculated on $SiO_2$ and/or $GeO_2$ bases, relative to the main oxide component.

It is here to be noted that the oxides may deviate somewhat from their stoichiometric compositions although they are usually found therewith.

The inorganic insulating electron injecting layer should preferably have a band gap of at least 5 eV, and especially at least 6 eV. Preferably but not exclusively, the upper limit to the band gap is usually of the order of 8 eV. The electron affinity should preferably be of the order of 2.5 to 3 eV.

The values of the work function (electron affinity) and band gap are determined by a thin-film structure and a thin-film constituting material. The work function may be measured as by X-ray photoelectron spectrometry (XPS) harnessing photoemission, and the band gap value may be measured as by spectrometry.

The inorganic insulating electron injecting layer is usually in the form of a non-crystalline thin film or a laminate of such thin films.

Preferably but not exclusively, the inorganic insulating electron injecting layer should have a thickness of the order of 0.2 to 10 nm, and especially 1 to 10 nm.

The inorganic insulating electron injecting layer may be fabricated by various physical or chemical thin-film formation processes such as a sputtering process, and an EB evaporation process, with the sputtering process being preferred.

When the inorganic insulating electron injecting layer is formed by the sputtering process, it is preferable that the pressure of the sputtering gas during sputtering is in the range of 0.1 to 1 Pa. For the sputtering gas, inert gases used with an ordinary sputtering system, for instance, Ar, Ne, Xe, and Kr may be used. If required, $N_2$ may be used. Use may then be made of a sputtering atmosphere comprising a mixture of the sputtering gas with about 1 to 99% Of $O_2$. A single- or multi-stage sputtering process may be performed using the aforesaid oxide or oxides for a target or targets.

When there is a fear that the organic layers, etc. may be ashed and so damaged during the lamination of the inorganic electron injecting layer, it is preferable to divide the inorganic electron injecting layer to two layers before lamination. That is, the first layer is laminated thin with no addition of oxygen thereto, and the second layer is then laminated thick with the addition of oxygen thereto. In this case, the first layer with no oxygen added thereto should have a thickness that is about 1/5 to 4/5 of the total thickness. At this time, the oxygen-deficient layer formed with no addition of oxygen thereto should preferably an oxygen content of the order of 60 to 90%. The oxide layer formed with the addition of oxygen thereto is usually found with stoichiometric composition for an ordinary oxide. However, the oxide layer composition may deviate somewhat from the stoichiometric composition. Accordingly, the difference in oxygen content between the oxygen-deficient layer and the oxidized layer should preferably be at least 10%, and especially at least 20%. Alternatively, the oxygen content may change continuously in the above range.

For the sputtering process, an RF sputtering process using an RF power source, a DC sputtering process, etc. may be used, with the RF sputtering process being most preferred. Power for a sputtering system is preferably in the range of 0.1 to 10 W/cm$^2$ for RF sputtering, and the film deposition rate is preferably in the range of 0.5 to 10 nm/min., and especially 1 to 5 nm/min.

During film deposition, the temperature of the substrate is of the order of room temperature (25° C.) to 150° C.

For the electron injecting electrode material, for instance, it is preferable to use materials having a low work function, e.g., pure metal elements such as K, Li, Na, Mg, La, Ce, Ca, Sr, Ba, Al, Ag, In, Sn, Zn, and Zr, and a binary or ternary alloy system serving as a stability improver and containing these elements, e.g., Ag.Mg (Ag: 0.1 to 50 at %), Al.Li (Li: 0.01 to 12 at %), In.Mg (Mg: 50 to 80 at %), and Al.Ca (Ca: 0.01 to 20 at %). For the electron injecting electrode layer, a thin film made up of each of these materials, and a multilayer thin film made of two or more such materials may be used.

The electron injecting electrode thin film should preferably have at least a certain thickness enough to inject electrons or a thickness of at least 0.1 nm, preferably at least 0.5 nm, and more preferably at least 1 nm. Although there is no particular upper limit to the thickness, the electrode may usually have a thickness of the order of 1 to 500 nm. Additionally, an auxiliary electrode (protective electrode) may be located on the electron injecting electrode.

The auxiliary electrode should preferably have at least a certain thickness enough to ensure electron injection efficiency and prevent entrance of moisture, oxygen or organic solvents or a thickness of preferably at least 50 nm, more preferably at least 100 nm, and even more preferably 100 to 500 nm. With too thin an auxiliary electrode, neither is its own effect obtainable, nor is sufficient connection with terminal electrodes obtainable because the ability of the auxiliary electrode to cover steps becomes low. When the auxiliary electrode is too thick, on the other hand, the growth rate of dark spots becomes high because of an increase in the stress of the auxiliary electrode.

The auxiliary electrode should preferably be formed of the optimum material chosen depending on the electron injecting electrode material used in combination therewith. For instance, a low-resistance metal such as Al may be used if it is important to ensure electron injection efficiency, and a metal compound such as TiN may be used if emphasis is placed on sealability.

Preferably but not exclusively, the total thickness of the electron injecting electrode plus the auxiliary electrode should usually be of the order of 50 to 500 nm.

The hole injecting electrode should preferably be composed of a material that can inject holes into the hole injecting layer with high efficiency and has a work function of 4.5 eV to 5.5 eV, for instance, any one of tin-doped indium oxide (ITO), zinc-doped indium oxide (IZO), indium oxide (In$_2$O$_3$), tin oxide (SnO$_2$), and zinc oxide (ZnO). It is here to be noted that these oxides may deviate slightly from their stoichiometric compositions. Regarding ITO, it is desired that the mixing ratio of SnO$_2$ with respect to In$_2$O$_3$ be in the range of 1 to 20 wt %, and especially 5 to 12 wt %. Regarding IZO, the mixing ratio of ZnO with respect to In$_2$O$_3$ is usually in the range of 12 to 32 wt %.

The hole injecting electrode may further contain silicon oxide (SiO$_2$) for work function control. The content of silicon oxide (SiO$_2$) should preferably be of the order of 0.5 to 10% in terms of the molar ratio of SiO$_2$ to ITO. The incorporation of SiO$_2$ contributes to an increase in the work function of ITO.

The electrode on the side out of which light is taken should preferably have a light transmittance of at least 80%, and more especially at least 90% with respect to light emitted at an emission wavelength of usually 400 to 700 nm. With decreasing transmittance, the light emitted from the light emitting layer attenuates, and so it is difficult to obtain the luminance needed for an light emitting device.

The electrode should preferably have a thickness of 50 to 500 nm, and especially 50 to 300 nm. Although there is no particular upper limit to the electrode thickness, too thick an electrode gives rise to concerns such as a transmittance drop, and defoliation. Too thin an electrode fails to obtain sufficient effect, and offers a problem in conjunction with film strength, etc. during device fabrication.

Figure 1:
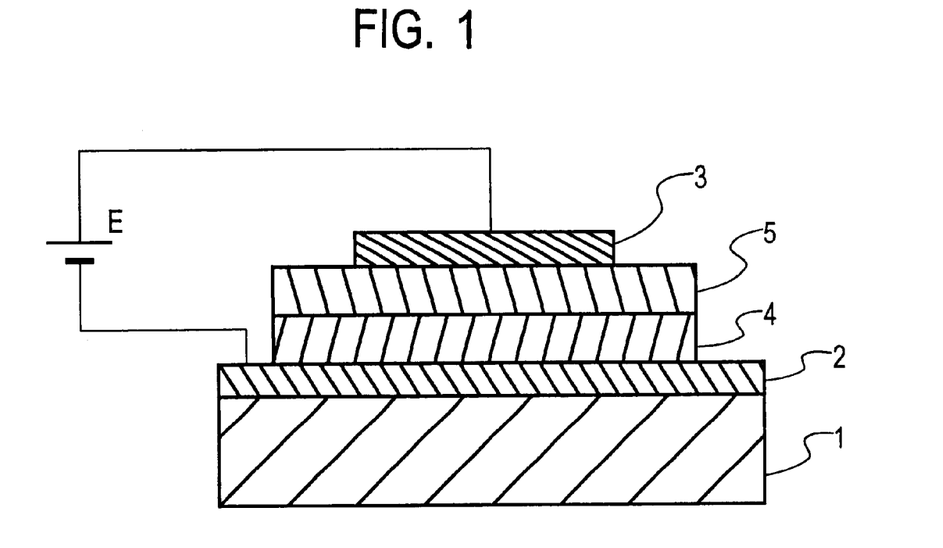
FIG. 1 is a sectional schematic of one embodiment of the organic EL device according to the invention.
Figure 2:
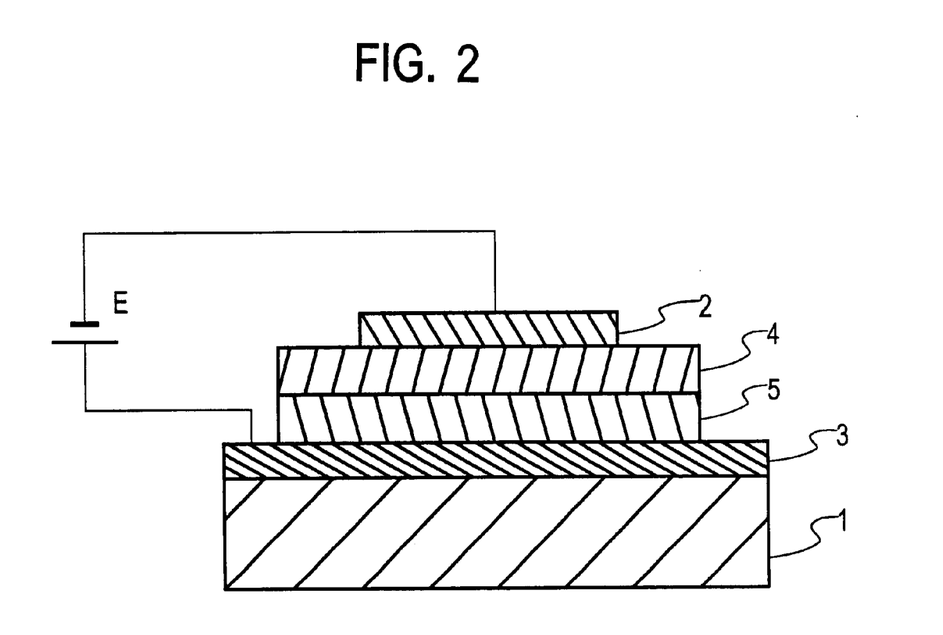
FIG. 2 is a sectional schematic of another embodiment of the organic EL device according to the invention.

One embodiment of the organic EL device of the invention should preferably have a multilayer structure reverse to an ordinary multilayer structure (a hole injecting layer is located on the substrate side), which comprises, in order from a substrate 1, an electron injecting electrode 2, an inorganic insulating electron injecting layer 4, a light emitting layer 5 and a hole injecting electrode 3 laminated together on the substrate 1, as typically shown in FIG. 1. The reversed multilayer structure makes it possible to prevent damage to the organic layers due to ashing during the formation of the inorganic insulating electron injecting layer. As typically shown in FIG. 2, a multilayer structure comprising, in order from a substrate 1, a hole injecting electrode 3, a light emitting layer 5, an inorganic insulating electron injecting layer 4 and an electron injecting electrode 2 laminated together on the substrate 1 is also acceptable. Preferably in this case, the inorganic insulating electron injecting layer should have such a double-layer structure as already noted. These embodiments may be properly chosen depending on display specifications, and display fabrication processes, etc. In FIGS. 1 and 2, a driving power source E is connected between the hole injecting electrode 3 and the electron injecting electrode 2. The above light emitting layer 5 is here understood to refer to a light emitting layer in a broad sense and so encompass a hole injecting and transporting layer, a light emitting layer in a narrow sense, a hole transporting layer, etc.

In the device according to the invention, layer units such as an electrode layer/inorganic layer (inorganic insulating electron injecting layer), a light emitting layer/electrode layer/inorganic layer, a light emitting layer/electrode layer/ inorganic layer, a light emitting layer/electrode layer, and so on may be cascaded one upon another. Such a device structure enables color tone control of emitted light, and multicolor light emission.

The light emitting layer is made up by lamination of at least one, or two or more organic compound thin films taking part in light emission function.

The light emitting layer has functions of injecting holes and electrons, transporting them, and recombining holes and electrons to create excitons. For the light emitting layer, it is preferable to use a relatively electronically neutral compound, so that the electrons and holes can be easily injected and transported in a well-balanced state.

If required, the light emitting layer may contain in addition to the light emitting layer in a narrow sense a hole injecting and transporting layer, an electron transporting layer, etc.

The hole transporting layer has functions of facilitating injection of holes from the hole injecting electrode, providing stable transportation of holes and blocking electrons. The electron transporting layer, provided as occasion demands, has functions of facilitating injection of electrons from the inorganic electron injecting layer, providing stable transportation of electrons and blocking holes. These layers are effective for increasing the number of holes and electrons injected into the light emitting layer and confining holes and electrons therein for optimizing the recombination region to improve light emission efficiency.

Preferably but not exclusively, the thickness of the light emitting layer, the thickness of the hole injecting and transporting layer, and the thickness of the electron transporting layer should preferably be of the order of usually 5 to 500 nm, and especially 10 to 300 nm although varying depending on their formation processes.

The thickness of the hole injecting and transporting layer, and the electron transporting layer is approximately equal to, or ranges from about 1/10 times to about 10 times, the thickness of the light emitting layer although it depends on the design of the recombination/light emitting region. When the hole injecting and transporting layer is separated into an injecting layer and a transporting layer, it is preferable that the injecting layer is at least 1 nm thick and the transporting layer is at least 1 nm thick. The upper limit to thickness is usually about 500 nm for the injecting layer and about 500 nm for the transporting layer. The same film thickness is also true of the case where two injecting and transporting layers are provided.

In the organic EL device according to the invention, the light emitting layer contains a fluorescent material that is a compound capable of emitting light. The fluorescent material used herein, for instance, may be at least one compound selected from compounds such as those disclosed in JP-A 63-264692, e.g., quinacridone, rubrene, and styryl dyes. Use may also be made of quinoline derivatives such as metal complex dyes containing 8-quinolinol or its derivative as ligands, for instance, tris(8-quinolinolato)aluminum, tetraphenylbutadiene, anthracene, perylene, coronene, and 12-phthaloperinone derivatives. Use may further be made of phenylanthracene derivatives disclosed in JP-A 8-12600 (Japanese Patent Application No. 6-110569) and tetraarylethene derivatives disclosed in JP-A 8-12969 (Japanese Patent Application No. 6-114456).

Preferably, the fluorescent compound is used in combination with a host substance capable of emitting light by itself; that is, it is preferable that the fluorescent compound is used as a dopant. In such a case, the content of the fluorescent compound in the light emitting layer is in the range of preferably 0.01 to 10% by weight, and especially 0.1 to 5% by weight. By using the fluorescent compound in combination with the host substance, it is possible to vary the wavelength performance of light emission of the host substance, thereby making light emission possible on a longer wavelength side and, hence, improving the light emission efficiency and stability of the device.

Quinolinolato complexes, and aluminum complexes containing 8-quinolinol or its derivatives as ligands are preferred for the host substance. Such aluminum complexes are typically disclosed in JP-A's 63-264692, 3-255190, 570733, 5-258859, 6-215874, etc.

Exemplary aluminum complexes include tris(8-quinolinolato)aluminum, bis(8-quinolinolato)magnesium, bis(benzo{f}-8-quinolinolato) zinc, bis(2-methyl-8-quinolinolato)aluminum oxide, tris(8-quinolinolato)indium, tris(5-methyl-8-quinolinolato)aluminum, 8-quinolinolato-lithium, tris(5-chloro-8-quinolinolato)gallium, bis(5-chloro-8-quinolinolato)calcium, 5,7-dichloro-8-quinolinolato-aluminum, tris(5,7-dibromo-8-hydroxyquinolinolato) aluminum, and poly[zinc(II)-bis(8-hydroxy-5-quinolinyl) methane].

Use may also be made of aluminum complexes containing other ligands in addition to 8-quinolinol or its derivatives, for instance, bis(2-methyl-8-quinolinolato)(phenolato) aluminum (III), bis(2-methyl-8-quinolinolato)(o-cresolato) aluminum (III), bis(2-methyl-8-quinolinolato)(m-cresolato) aluminum (III), bis(2-methyl-8-quinolinolato)(p-cresolato) aluminum (III), bis(2-methyl-8-quinolinolato)(o-phenylphenolato)aluminum (III), bis(2-methyl-8-quinolinolato) (m-phenylphenolato)aluminum (III), bis(2-methyl-8-quinolinolato) (p-phenylphenolato)aluminum (III), bis(2-methyl-8-quinolinolato)(2,3-dimethylphenolato)aluminum (III), bis(2-methyl-8-quinolinolato)(2,6-dimethylphenolato) aluminum (III), bis(2-methyl-8-quinolinolato)(3,4-dimethylphenolato)aluminum (III), bis(2-methyl-8-quinolinolato)(3,5-dimethylphenolato) aluminum (III), bis(2-methyl-8-quinolinolato)(3,5-di-tertbutylphenolato) aluminum (III), bis(2-methyl-8-quinolinolato) (2,6-diphenylphenolato)aluminum (III), bis(2-methyl-8-quinolinolato)(2,4,6-triphenylphenolato)aluminum (III), bis (2-methyl-8-quinolinolato)(2,3,6-trimethylphenolato) aluminum (III), bis(2-methyl-8-quinolinolato) (2,3,5,6-tetramethylphenolato)aluminum (III), bis(2-methyl-8-quinolinolato)(1-naphtholato)aluminum (III), bis(2-methyl-8-quinolinolato)(2-naphtholato)aluminum (III), bis(2,4-dimethyl-8-quinolinolato)(o-phenylphenolato)aluminum (III), bis(2,4-dimethyl-8-quinolinolato)(p-phenylphenolato) aluminum (III), bis(2,4-dimethyl-8-quinolinolato)(m-phenylphenolato) aluminum (III), bis(2,4-dimethyl-8-quinolinolato)(3,5-dimethylphenolato)aluminum (III), bis (2,4-dimethyl-8-quinolinolato)(3,5-di-tertbutylphenolato) aluminum (III), bis(2-methyl-4-ethyl-8-quinolinolato)(p-cresolato)aluminum (III), bis(2-methyl-4-methoxy-8-quinolinolato)(p-phenyl-phenolato)aluminum (III), bis(2-methyl-5-cyano-8- quinolinolato)(o-cresolato)aluminum (III), and bis(2-methyl-6-trifluoromethyl-8-quinolinolato) (2-naphtholato)aluminum (III).

Besides, use may be made of bis(2-methyl-8-quinolinolato)aluminum (III)-$\mu$-oxo-bis(2-methyl-8-quinolinolato) aluminum (III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum (III)-$\mu$-oxo-bis(4-ethyl-2-methyl-8-quinolinolato)aluminum (III), bis(2-methyl-4-methoxyquinolinolato)aluminum (III)-$\mu$-oxo-bis(2-methyl-4-methoxyquinolinolato)aluminum (III), bis(5-cyano2-methyl-8-quinolinolato)aluminum (III)-$\mu$-oxo-bis(5-cyano2-methyl-8-quinolinolato)aluminum (III), bis(2-methyl-5-trifluoromethyl-8-quinolinolato)aluminum (III)-$\mu$-oxo-bis(2-methyl-5-trifluoromethyl-8-quinolinolato) aluminum (III), etc.

Other preferable host substances include phenyl-anthracene derivatives disclosed in JP-A 8-12600 (Japanese Patent Application No. 6-110569), tetraarylethene derivatives disclosed in JP-A 8-12969 (Japanese Patent Application No. 6-114456), etc.

In the practice of the invention, the light emitting layer may also serve as an electron transporting layer. In this case, it is preferable to use a fluorescent material, e.g., tris(8-quinolinolato)aluminum or the like, which may be provided by deposition by evaporation.

If necessary or preferably, the light emitting layer is formed of a mixed layer of at least one compound capable of injecting and transporting holes with at least one compound capable of injecting and transporting electrons. Preferably in this case, a dopant is incorporated in the mixed layer. The content of the dopant compound in the mixed layer is in the range of preferably 0.01 to 20% by weight, and especially 0.1 to 15% by weight.

In the mixed layer with a hopping conduction path available for carriers, each carrier migrates in the polarly prevailing substance, so making the injection of carriers having an opposite polarity unlikely to occur. This leads to an increase in the service life of the device due to less damage to the organic compound. By incorporating the aforesaid dopant in such a mixed layer, it is possible to vary the wavelength performance of light emission that the mixed layer itself possesses, thereby shifting the wavelength of light emission to a longer wavelength side and improving the intensity of light emission, and the stability of the device as well.

The compound capable of injecting and transporting holes and the compound capable of injecting and transporting electrons, both used to form the mixed layer, may be selected from compounds for the injection and transportation of holes and compounds for the injection and transportation of electrons, as will be described later. Especially for the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

For the compounds capable of injecting and transporting electrons, it is preferable to use metal complexes containing quinoline derivatives, especially 8-quinolinol or its derivatives as ligands, in particular, tris(8-quinolinolato) aluminum (Alq3). It is also preferable to use the aforesaid phenylanthracene derivatives, and tetraarylethene derivatives.

For the compound for the injection and transportation of holes, it is preferable to use an amine derivative having strong fluorescence, for instance, a triphenyldiamine derivative that is the aforesaid hole transporting compound, a styrylamine derivative, and an amine derivative having an aromatic fused ring.

In this case, the ratio of mixing the compound capable of injecting and transporting holes with respect to the compound capable of injecting and transporting electrons is determined while the carrier mobility and carrier density are taken into consideration. In general, however, it is preferred that the weight ratio between the compound capable of injecting and transporting holes and the compound capable of injecting and transporting electrons is of the order of 1/99 to 99/1, especially 10/90 to 90/10, and more especially 20/80 to 80/20.

The mixed layer should have a thickness that is equal to or larger than the thickness of a single molecular layer and less than the thickness of the organic compound layer. More specifically, the mixed layer has a thickness of preferably 1 to 85 nm, especially 5 to 60 nm, and more especially 5 to 50 nm.

Preferably, the mixed layer is formed by co-evaporation where the selected compounds are evaporated from different evaporation sources. When the compounds to be mixed have identical or slightly different vapor pressures (evaporation temperatures), however, they may have previously been mixed together in the same evaporation boat for the subsequent evaporation. Preferably, the compounds are uniformly mixed together in the mixed layer. However, the compounds in an archipelagic form may be present in the mixed layer. The light emitting layer may generally be formed at a given thickness by the evaporation of the organic fluorescent substance or coating a dispersion of the organic fluorescent substance in a resin binder.

For the hole injecting and transporting layer, use may be made of various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (triaryldiamine or triphenyl-diamine (TPD)), aromatic tertiary amines, hydrazone derivatives, carbazole derivatives, triazole derivatives, imidazole derivatives, oxadiazole derivatives having an amino group, oligothiophenes, and polythiophenes. These compounds may be used singly or in combination of two or more. Where two or more such compounds are used, they may be stacked as separate layers, or otherwise mixed.

For the electron transporting layer which is provided if necessary, there may be used quinoline derivatives such as organic metal complexes containing 8-quinolinol or its derivatives as ligands, for instance, tris(8-quinolinolato) aluminum (Alq3), oxadiazole derivatives, perylene derivatives, pyridine derivatives, pyrimidine derivatives, quinoxaline derivative, diphenylquinone derivatives, and nitro-substituted fluorene derivatives. The electron transporting layer may also serve as a light emitting layer. In this case, it is preferable to use tris(8-quinolilato)aluminum, etc. The electron transporting layer should preferably be formed by deposition by evaporation, etc., as is the case with the light emitting layer. Usually, the electron transporting layer comprising an organic material is not needed; it may be provided depending on the device arrangement, and other conditions.

Preferably, the hole injecting and transporting layer, the light emitting layer, and the electron transporting layer comprising an organic material are formed by a vacuum evaporation process because a uniform thin film can then be obtained. With the vacuum evaporation process, it is thus possible to obtain a uniform thin film in an amorphous state or with a grain size of up to 0.2 μm. A grain size of greater than 0.2 μm results in non-uniform light emission. To avoid this, it is required to make the driving voltage of the device high. However, this in turn gives rise to some considerable drop of hole injection efficiency.

No special limitation is imposed on conditions for vacuum evaporation. However, the vacuum evaporation should preferably be carried out at a degree of vacuum of up to $10^{-4}$ Pa and a deposition rate of about 0.01 to 1 nm/sec. Also, the layers should preferably be continuously formed in vacuo, partly because the deposition of impurities on the interface between adjacent layers is avoidable resulting in the achievement of high performance, and partly because the driving voltage of the device can be lowered with elimination of dark spots or no growth of dark spots.

When the layers, each containing a plurality of compounds, are formed by the vacuum evaporation process, it is preferable that co-evaporation is carried out while each boat with the compounds charged therein is placed under temperature control.

Preferably, the device is sealed up by means of a sealing sheet, etc. for the purpose of preventing oxidation of the organic layers and electrodes in the device. To prevent penetration of moisture, the sealing sheet is bonded to the device using an adhesive resin layer to seal up the device. An inert gas such as Ar, He, and $N_2$ is preferably used as a sealing gas. Then, the sealing gas should preferably have a moisture content of up to 100 ppm, especially up to 10 ppm, and more especially up to 1 ppm. Although there is no particular lower limit to the moisture content, the sealing gas should usually have a moisture content of about 0.1 ppm.

The sealing sheet, preferably in a flat sheet form, may be made of transparent or translucent materials such as glasses, quartz, and resins, among which the glasses are preferred. For such glass materials, alkali glass is preferable from a cost standpoint. Other preferable glass materials, for instance, include soda lime glass, lead alkali glass, borosilicate glass, aluminosilicate glass, and silica glass. In particular, a soda glass material subjected to no surface treatment is inexpensive and so is preferable. A metal sheet, a plastic sheet or the like, too, may be used in place of the sealing glass sheet.

For height control, a spacer is used to keep the sealing sheet at a height as desired. The spacer material may be resin beads, silica beads, glass beads, glass fibers, etc., with the glass beads being most preferred. The spacer is usually in a particulate form having a uniform particle size. In the invention, however, a spacer of any desired shape may be used provided that it can function well. The spacer size should preferably be 1 to 20 $\mu$m, especially 1 to 10 $\mu$m, and more especially 2 to 8 $\mu$m as calculated on a circle diameter basis. A spacer having such a diameter should preferably have a particle length of up to about 100 $\mu$m. Although there is no particular lower limit to the particle size, the particle size should usually be equal to or larger than the diameter.

The spacer may or may not be used when a recess is provided in the sealing sheet. When the spacer is used, its size is preferably within the aforesaid range, and more preferably within the range of 2 to 8 $\mu$m.

The spacer may have been incorporated in the sealing adhesive agent or may be incorporated in the sealing adhesive agent at the time of bonding. The content of the spacer in the sealing adhesive agent should be preferably 0.01 to 30 wt %, and more preferably 0.1 to 5 wt %.

For the adhesive agent, it is preferable to use a cation curing epoxy resin of the ultraviolet curing type, although an adhesive agent of the type that ensures stable adhesion strength and good airtightness may be used.

For the substrate on which an organic EL structure is formed according to the invention, a non-crystalline substrate such as a glass or quartz substrate, and a crystalline substrate such as an Si, GaAs, ZnSe, ZnS, GaP or InP substrate may be used. The crystalline substrate may also be provided with a crystalline or non-crystalline buffer layer or a metal buffer layer. For a metal substrate, Mo, Al, Pt, Ir, Au, Pd, and other metal substrates may be used. However, it is preferable to use a glass substrate. The substrate is usually located on the side out of which light is taken, and so it should preferably be transparent to light as in the above electrodes.

In the present invention, a number of devices may be arranged on a plane. A color display may be constructed by changing the colors of light emitted from the devices arranged on the plane.

The substrate may be provided with a color filter film, fluorescent material-containing color conversion film or dielectric reflecting film for controlling the color of light emission.

For the color filter film, a color filter employed with liquid crystal display devices, etc. may be used. However, it is preferable to control the properties of the color filter in conformity to the light emitted from the organic EL device, thereby optimizing the efficiency of taking out light emission and color purity.

By using a color filter capable of cutting off extraneous light of such short wavelength as absorbed by the EL device material or the fluorescent conversion layer, it is possible to improve the light resistance of the device and the contrast of what is displayed on the device.

Instead of the color filter, an optical thin film such as a dielectric multilayer film may be used.

The fluorescent color conversion film absorbs light emitted from an EL device and gives out light from the phosphors contained therein for the color conversion of light emission, and is composed of three components, a binder, a fluorescent material and a light absorbing material.

In the practice of the invention, it is basically preferable to use a fluorescent material having high fluorescent quantum efficiency, and especially a fluorescent material having strong absorption in an EL light emission wavelength region. Laser dyes are suitable for the practice of the invention. To this end, for instance, it is preferable to use rohodamine compounds, perylene compounds, cyanine compounds, phthalocyanine compounds (including subphthalocyanine compounds, etc.), naphthaloimide compounds, fused cyclic hydrocarbon compounds, fused heterocyclic compounds, styryl compounds, and coumarin compounds.

For the binder, it is basically preferable to make an appropriate selection from materials that do not extinguish fluorescence. It is particularly preferable to use a material that can be finely patterned by photolithography, printing or the like. When the color conversion filter film is provided on the substrate while it is in contact with the hole injecting electrode, it is also preferable to use a binder material that is not damaged during the formation of the hole injecting electrode (ITO, IZO).

The light absorbing material is used when light is not fully absorbed by the fluorescent material, and so may be dispensed with, if not required. For the light absorbing material, it is preferable to make a selection from materials that do not extinguish fluorescence.

The organic EL device of the invention is generally of the DC or pulse drive type while it may be of the AC drive type. The applied voltage is generally of the order of 2 to 30 volts.

EXAMPLE

The present invention is explained more specifically with reference to some examples.

Example 1

A 7059 substrate (made by Corning) used as a glass substrate was scrubbed with neutral detergent.

Then, the substrate was fixed to a substrate holder in a vacuum evaporation system, which was evacuated to a vacuum of $1\times10^{-4}$ Pa or lower. With the vacuum kept, Al was deposited by evaporation to a thickness of 20 nm and $Li_2O$ was then deposited by evaporation to a thickness of 5 nm, thereby forming an auxiliary electrode and an electron injecting electrode.

With the vacuum still kept, the substrate with the electrodes formed thereon was transferred into a sputtering system where an inorganic electron injecting layer was formed to a thickness of 1 nm, using as a target a mixture of potassium oxide ($K_2O$ having an electron affinity of 2.0 eV) and 5 mol % of silicon oxide ($SiO_2$). Regarding the film deposition conditions applied to this end, the substrate temperature was 25° C., a mixture of Ar and $O_2$ at 1:1 was used for the sputtering gas, the film deposition rate was 1 nm/min., the operating pressure was 0.5 Pa, and the input power was 5 W/cm$^2$.

With the vacuum still kept, N,N,N',N'-tetrakis(m-biphenyl)-1,1'-biphenyl-4,4'-diamine (TPD), tris(8-quinolinolato)aluminum (Alq3) and rubrene were deposited by evaporation at an overall deposition rate of 0.2 nm/sec. to a thickness of 40 nm thereby forming a light emitting layer. The mixture of TPD and Alq3 at 1:1 by weight was doped with 5 vol % of rubrene.

Then, TPD was deposited by evaporation at a deposition rate of 0.1 nm/sec. to a thickness of 20 nm thereby forming a hole transporting layer, and polythiophene was deposited by evaporation at a deposition rate of 0.1 nm/sec. to a thickness of 10 nm thereby forming a hole injecting layer.

Further, a 200-nm thick ITO hole injecting electrode layer was formed by a DC magnetron sputtering process using an ITO oxide target.

Finally, the EL structure was sealed up by glass to obtain an organic EL device (of the reversed lamination type).

A comparative organic EL device sample was prepared as mentioned above with the exception that instead of forming the inorganic hole injecting layer, tris(8-quinolinolato) aluminum (Alq3) was deposited at a deposition rate of 0.2 nm/sec. to a thickness of 30 nm thereby forming an electron injecting and transporting layer.

By X-ray fluorescence composition analysis of the $K_2O$/$SiO_2$ mixture thin film, the molar ratio of $SiO_2$ with respect to $K_2O$ was found to be 4.9%.

When an electric field was applied to the obtained organic EL device in the air, it showed diode performance. When the device was biased with ITO on a positive side and AlLi on a negative side, the current increased with increasing voltage, and distinct light emission was observed from the sealing sheet side in an ordinary room. Even upon repetitive emission operations, no luminance decrease was found.

The device was subjected to accelerated testing while a constant current of 100 mA/cm$^2$ was applied thereto, thereby evaluating its emission luminance and life performance. An about 10% improvement in emission luminance was obtained as compared with the comparative sample prepared in the same manner with the exception that the electron injecting and transporting layer was formed of a conventional organic material. The luminance of the comparative sample decreased to half after the passage of 200 hours, whereas the inventive sample was found to keep at least 80% of the initial luminance even after the passage of 200 hours.

The improved life performance achieved in the instant example appears to be primarily because the electron injecting layer is formed using the chemically stable inorganic oxide instead of the organic compound, so that the blocking of holes and the injection of electrons into the light emitting layer can take place effectively and stably over an extended period of time.

Example 2

The same substrate as in Example 1 was fixed to a substrate holder in a sputtering system, where a 200-nm thick ITO hole injecting electrode layer was formed by a DC magnetron sputtering process using an ITO oxide target.

The substrate with the ITO film formed thereon was ultrasonically washed with neutral detergent, acetone, and ethanol, and pulled up from boiling ethanol, followed by drying. Subsequently, the substrate was washed on its surface with UV/$O_3$, and then fixed to a substrate holder in a vacuum evaporation system, which was evacuated to 1×10$^{-4}$ Pa or lower.

Then, polythiophene was deposited by evaporation at a deposition rate of 0.1 nm/min. to a thickness of 10 nm thereby forming a hole injecting layer, and TPD was deposited by evaporation at a deposition rate of 0.1 nm/sec. to a thickness of 20 nm thereby forming a hole transporting layer.

With the vacuum still kept, N,N,N',N'-tetrakis(m-biphenyl)-1,1'-biphenyl-4,4'-diamine (TPD), tris(8-quinolinolato)aluminum (Alq3)and rubrene were deposited by evaporation at an overall deposition rate of 0.2 nm/sec. to a thickness of 40 nm thereby forming a light emitting layer. The mixture of TPD and Alq3 at 1:1 by weight was doped with 5 vol % of rubrene.

With the vacuum still kept, the substrate with the electrodes formed thereon was transferred into a sputtering system where an inorganic insulating electron injecting layer was formed to a thickness of 1 nm, using as a target a mixture of potassium oxide ($K_2O$ having an electron affinity of 2.0 ev) and 5 mol % of silicon oxide ($SiO_2$). Regarding the film deposition conditions applied to this end, the substrate temperature was 25° C., the film deposition rate was 1 nm/min., the operating pressure was 0.5 Pa, and the input power was 5 W/cm$^2$. In this example, a first portion of the inorganic insulating electron injecting layer was formed to a thickness of 0.5 nm while a 100% Ar sputtering gas was fed at 100 SCCM. Then, a second portion of the inorganic insulating electron injecting layer was formed to a thickness of 0.5 nm while a sputtering gas of Ar/$O_2$ at 1:1 was fed at 100 SCCM.

With the vacuum still kept, $Li_2O$ was deposited by evaporation to a thickness of 5 nm, and Al was subsequently deposited by evaporation to a thickness of 20 nm, thereby forming an electron injecting electrode and an auxiliary electrode.

Finally, the EL structure was sealed up by glass to obtain an organic EL device (of the ordinary lamination type).

By X-ray fluorescence composition analysis of the $K_2O$/$SiO_2$ mixture thin film, the oxygen content of the lower layer (formed with no $O_2$ added thereto) was found to be about 70% as usual.

The device was driven as in Example 1 with the application of voltage between the hole injecting electrode and the electron injecting electrode. As a result, much the same light emission as in Example 1 could be found on the substrate side.

Example 3

A 7059 substrate (made by Corning) used as a glass substrate was scrubbed with neutral detergent.

Then, the substrate was fixed to a substrate holder in a vacuum evaporation system, which was evacuated to a vacuum of 1×10$^{-4}$ Pa or lower. With the vacuum kept, Al was deposited by evaporation to a thickness of 20 nm and $Li_2O$ was subsequently deposited by evaporation to a thickness of 5 nm, thereby forming an auxiliary electrode and an electron injecting electrode.

With the vacuum still kept, the substrate with the electrodes formed thereon was transferred into a sputtering system where an inorganic electron injecting layer was formed to a thickness of 1 nm, using as a target a mixture of rubidium oxide ($Rb_2O$) and 3 mol % of germanium oxide ($GeO_2$). Regarding the film deposition conditions applied to this end, the substrate temperature was 25° C., a mixture of Ar and $O_2$ at 1:1 was used for the sputtering gas, the film deposition rate was 1 nm/min., the operating pressure was 0.5 Pa, and the input power was 5 W/cm².

With the vacuum still kept, N,N,N',N'-tetrakis(m-biphenyl)-1,1'-biphenyl-4,4'-diamine (TPD), tris(8-quinolinolato)aluminum (Alq3) and rubrene were deposited by evaporation at an overall deposition rate of 0.2 nm/sec. to a thickness of 40 nm thereby forming a light emitting layer. The mixture of TPD and Alq3 at 1:1 by weight was doped with 5 mol % of rubrene.

Then, TPD was deposited by evaporation at a deposition rate of 0.1 nm/min. to a thickness of 20 nm thereby forming a hole transporting layer, and polythiophene was deposited by evaporation at a deposition rate of 0.1 nm/min. to a thickness of 10 nm thereby forming a hole injecting layer.

Further, a 200-nm thick ITO hole injecting electrode layer was formed by a DC magnetron sputtering process using an ITO oxide target.

Finally, the EL structure was sealed up by glass to obtain an organic EL device (of the reversed lamination type).

A comparative organic EL device sample was prepared as mentioned above with the exception that instead of forming the inorganic hole injecting layer, tris(8-quinolinolato) aluminum (Alq3) was deposited by evaporation at a deposition rate of 0.2 nm/sec. to a thickness of 30 nm thereby forming an electron injecting transporting layer.

By X-ray fluorescence composition analysis of the $Rb_2O$/$GeO_2$ mixture thin film, the molar ratio of $GeO_2$ with respect to $Rb_2O$ was found to be 2.9%.

When an electric field was applied to the obtained organic EL device in the air, it showed diode performance. When the device was biased with ITO on a positive side and AlLi on a negative side, the current increased with increasing voltage, and distinct light emission was observed from the sealing sheet side in an ordinary room. Even upon repetitive emission operations, no luminance decrease was found.

The device was subjected to accelerated testing while a constant current of 100 mA/cm² was applied thereto, thereby evaluating its emission luminance and life performance. An about 10% improvement in emission luminance was obtained as compared with the comparative sample prepared in the same manner with the exception that the electron injecting and transporting layer was formed of a conventional organic material. The luminance of the comparative sample decreased to half after the passage of 200 hours, whereas the inventive sample was found to keep at least 80% of the initial luminance even after the passage of 200 hours.

The improved life performance achieved in the instant example appears to be primarily because the electron injecting layer is formed using the chemically stable inorganic oxide instead of the organic compound, so that the blocking of holes and the injection of electrons into the light emitting layer can take place effectively and stably over an extended period of time.

Example 4

Organic EL devices were prepared as in Example 1 with the exception of using as the main components of inorganic electron injecting layers at least one of lithium oxide ($Li_2O_3$), sodium oxide ($Na_2O$), cesium oxide ($Cs_2O$), calcium oxide (CaO), strontium oxide (SrO), barium oxide (BaO), yttrium oxide ($Y_2O_3$), hafnium oxide ($HfO_2$), terbium oxide ($Tb_2O_3$) and thorium oxide ($ThO_2$) instead of potassium oxide ($K_2O$). Much the same results as in Example 1 were obtained.

ADVANTAGES OF THE INVENTION

According to the invention as explained above, it is possible to provide an organic EL device which possesses the merits of both an organic material and an inorganic material, and has an extended life, an improved efficiency and a low driving voltage.

Japanese Patent Application No. 10-222272 is herein incorporated by reference.

Although some preferred embodiments have been described, many modifications and variations may be made thereto in the light of the above teachings. It is therefore to be understood that within the scope of the appended claims, the invention may be practiced otherwise than as specifically described.

What we claim is:

1. An organic electroluminescent device comprising a substrate, a hole injecting electrode and an electron injecting electrode formed on said substrate, and at least an organic layer located between said electrodes, said organic layer taking part in light emitting function, wherein:

between said electron injecting electrode and said organic layer there is an inorganic insulating electron injecting layer comprising as a main component an oxide having an electron affinity of up to 3 eV, with a stabilizing component added thereto, wherein said inorganic insulating electron injecting layer comprises as said main component at least one of lithium oxide, sodium oxide, potassium oxide, rubidium oxide, cesium oxide, calcium oxide, barium oxide, yttrium oxide, hafnium oxide, terbium oxide, and thorium oxide.

2. The organic electroluminescent device according to claim 1, wherein said inorganic electron injecting layer comprises as said stabilizing component germanium oxide or silicon oxide or a mixture thereof.

3. The organic electroluminescent device according to claim 2, wherein the stabilizing component is contained in an amount, calculated on $GeO_2$ or $SiO_2$ or mixture thereof bases, of up to 50 mol % relative to said main component.

4. The organic electroluminescent device according to claim 1, which comprises, in order from a substrate, at least an electron injecting electrode, an inorganic insulating electron injecting layer, a light emitting layer and a hole injecting layer laminated together thereon.

5. The organic electroluminescent device according to claim 1, wherein said inorganic electron injecting layer has a structure where oxygen is present in a larger amount on an organic layer side and oxygen is present in a smaller amount on an electron injecting electrode side.

6. The organic electroluminescent device according to claim 5, which comprises, in order from a substrate, at least a hole injecting electrode, an organic layer, an inorganic electron injecting layer and an electron injecting electrode laminated together thereon.

7. A method of fabricating an organic electro-luminescent device by forming between an electron injecting electrode and an organic layer an inorganic electron injecting layer comprising as a main component an oxide having an electron affinity of up to 3 eV with a stabilizing component added thereto, wherein:

one portion of said inorganic electron injecting layer corresponding to ⅕ to ⅘ of a total thickness thereof is formed with no oxygen added thereto, and another portion is formed with about 1 to 99% of O₂ added thereto.

8. The organic electroluminescent device fabrication method according to claim 7, wherein said inorganic electron injecting layer has a structure where oxygen is present in a larger amount on the organic layer side than is present on the electron injecting electrode side.

9. An organic electroluminescent device comprising a substrate, a hole injecting electrode and an electron injecting electrode formed on said substrate, and at least an organic layer located between said electrodes, said organic layer taking part in light emitting function, wherein:

between said electron injecting electrode and said organic layer there is an inorganic insulating electron injecting layer comprising as a main component an oxide having an electron affinity of up to 3 eV, with a stabilizing component added thereto, wherein said inorganic electron injecting layer has a structure where oxygen is present in a larger amount on the organic layer side than is present on the electron injecting electrode side.

10. The organic electroluminescent device according to claim 9, which comprises, in order from a substrate, at least a hole injecting electrode, an organic layer, an inorganic electron injecting layer and an electron injecting electrode laminated together thereon.

* * * * *